United States Patent
Kao et al.

(10) Patent No.: US 10,785,843 B2
(45) Date of Patent: Sep. 22, 2020

(54) ELECTRIC DEVICE CAPABLE OF REDUCING LIGHT INTERFERENCE

(71) Applicant: InnoLux Corporation, Miao-Li County (TW)

(72) Inventors: Ker-Yih Kao, Miao-Li County (TW); Liang-Lu Chen, Miao-Li County (TW); Chin-Lung Ting, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/365,628

(22) Filed: Mar. 26, 2019

(65) Prior Publication Data

US 2019/0327798 A1    Oct. 24, 2019

Related U.S. Application Data

(60) Provisional application No. 62/659,711, filed on Apr. 19, 2018.

(30) Foreign Application Priority Data

Sep. 26, 2018  (CN) .......................... 2018 1 1125193

(51) Int. Cl.
  *H05B 45/48*     (2020.01)
  *G09G 3/32*      (2016.01)
  *H01L 27/32*     (2006.01)
  *H05B 45/10*     (2020.01)
(52) U.S. Cl.
  CPC .............. *H05B 45/48* (2020.01); *G09G 3/32* (2013.01); *H01L 27/3262* (2013.01); *H05B 45/10* (2020.01)

(58) Field of Classification Search
  None
  See application file for complete search history.

(56) References Cited

U.S. PATENT DOCUMENTS

| | | | | |
|---|---|---|---|---|
| 9,510,415 | B1* | 11/2016 | Wang | H05B 45/10 |
| 2004/0135522 | A1* | 7/2004 | Berman | H05B 45/40 |
| | | | | 315/291 |
| 2010/0308739 | A1 | 12/2010 | Shteynberg | |
| 2011/0069094 | A1* | 3/2011 | Knapp | H05B 45/22 |
| | | | | 345/690 |
| 2012/0081009 | A1* | 4/2012 | Shteynberg | H05B 33/083 |
| | | | | 315/122 |
| 2013/0049610 | A1 | 2/2013 | Chen | |
| 2014/0210362 | A1* | 7/2014 | Shin | H05B 45/48 |
| | | | | 315/186 |

FOREIGN PATENT DOCUMENTS

WO       2011/010774 A1    1/2011

* cited by examiner

*Primary Examiner* — Crystal L Hammond
(74) *Attorney, Agent, or Firm* — Winston Hsu

(57) ABSTRACT

An electric device may include a first group and a first signal line coupled to the first group. The first group may include a first light-emitting diode (LED), a second LED and a first control circuit. The first LED and the second LED are coupled in series. The first control circuit is coupled to the first LED and the second LED for turning on one of the first LED and the second LED in a first mode, and turning on the first LED and the second LED in a second mode. Number of LEDs enabled in the first mode is less than number of LEDs enabled in the second mode.

10 Claims, 8 Drawing Sheets

US 10,785,843 B2

ELECTRIC DEVICE CAPABLE OF REDUCING LIGHT INTERFERENCE

CROSS REFERENCE TO RELATED APPLICATION

This application claims priority to provisional Patent Application No. 62/659,711, filed 2018 Apr. 19, and incorporated herein by reference in its entirety.

BACKGROUND OF THE DISCLOSURE

1. Field of the Disclosure

The disclosure relates to an electric device, and more particularly, an electric device capable of reducing light interference.

2. Description of the Prior Art

For the applications of active-matrix LED (light-emitting diode), every dimmable area which can be respectively dimmed can be designed to have a plurality of LEDs. For example, an area may have two transistors and one capacitor (i.e., 2T1C), and the two transistors can be controllable, where the two LEDs can be enabled or turned off together. The area is in a bright state when the two LEDs are enabled, and the area is in a dark state when the two LEDs are turned off. In order to improve the contrast of local dimming, the distance between an area and another area can be reduced, but this will lead to unwanted light interference between two areas. In order to lengthen life time of the LEDs, the number of enabled LEDs of specific groups can be decreased when displaying specific pictures.

SUMMARY OF THE DISCLOSURE

An embodiment provides an electric device including a group and a signal line. The group includes a first LED (light-emitting diode), a second LED and a control circuit. The first LED and the second LED are coupled in series. The control circuit is coupled to the first LED and the second LED for turning on one of the first LED and the second LED in a first mode, and turning on the first LED and the second LED in a second mode. The signal line is coupled to the group. Number of LEDs enabled in the first mode is less than number of LEDs enabled in the second mode.

These and other objectives of the present disclosure will no doubt become obvious to those of ordinary skill in the art after reading the following detailed description of the embodiment that is illustrated in the various figures and drawings.

DETAILED DESCRIPTION

Figure 1:
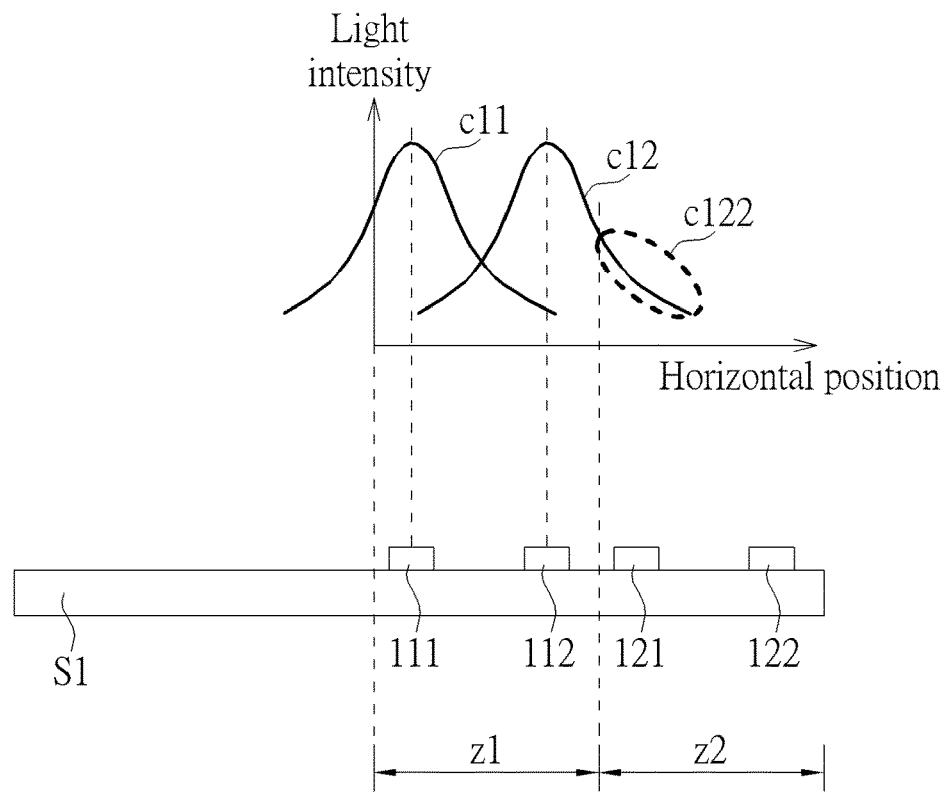
FIG. 1 illustrates that light interference between two areas according to prior art.
Figure 2:
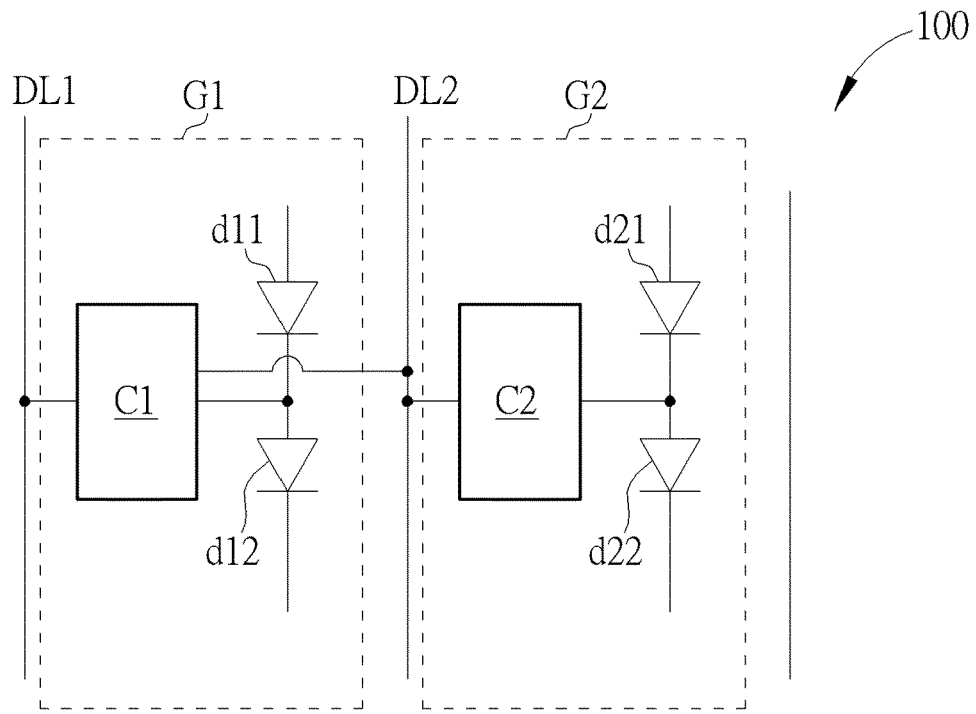
FIG. 2 illustrates an electric device 100 according to an embodiment.

FIG. 2 illustrates an electric device 100 according to an embodiment. The electric device 100 may include a first group G1 and a second group G2. The first group G1 may include at least two LEDs, an LED d11 (first LED) and an LED d12 (second LED), and a first control circuit C1. The first LED and the second LED are coupled in series as shown in FIG. 2. The first control circuit C1 may be coupled between the LED d11 and the LED d12. The first control circuit C1 may enable one of the LEDs d11 and d12 in a first mode, and enable the LEDs d11 and d12 in a second mode. In FIG. 2, each of the LED d11 and the LED d12 may be replaced with a plurality of LEDs coupled in series. In other words, when merely turning on one of the LEDs d11 and d12, it may be turning on a plurality of LEDs and turning off another plurality of LEDs. The abovementioned group may be a combination of LEDs on a same current path and a related control circuit, and the group mentioned below may have the same definition. In FIG. 2, merely a part of connections related to the control circuit C1 and the control circuit C2 are illustrated. Regarding the control circuits C1 and C2, more details are provided below.

As shown in FIG. 2, the first group G1 may be disposed adjacent to the second group G2. In the first mode, the first group G1 is in a bright state and the second group is in a dark state. In other words, merely one of the LEDs d11 and d12 is enabled, and the LEDs of the second group G2 are turned off. In the second mode, the first group G1 and the second group G2 are in the bright state. According to an embodiment, in the first mode, merely one of the LEDs d11 and d12 is enabled, so the number of LEDs enabled in the first mode is less than the number of LEDs enabled in the second mode, and the light interference brought by the first group G1 to the second group G2 is reduced. According to an embodiment, when a group is in the bright state, it means that at least one LED in the group is enabled. When a group is in the dark state, it means that no LED emits light in the group. According to another embodiment, a group in the dark state may still have slight brightness. For example, it is allowed when a ratio of the brightness in the bright state and the brightness in the dark state is substantially greater than 800:1. The grayscale of the bright state and the dark state are not particularly limited herein. As long as the difference of brightness (grayscale voltage) between two adjacent groups is sufficient to reduce the brightness of one of the LEDs of the relatively brighter group, then the group with higher brightness of the two adjacent groups may be the group in the bright state in the text herein, and the group with lower brightness may be a group in the dark state herein.

As shown in FIG. 2, the electric device 100 may further include a first signal line DL1 and a second signal line DL2. The second group G2 includes a second control circuit C2, an LED d21 (a third LED) and an LED d22 (a fourth LED).

The LED d21 and the LED d22 are coupled in series. The first signal line DL1 is coupled to the first group G1. The second signal line DL2 is coupled to the second group G2. In the text herein, a mentioned signal line may be a data line or another sort of line for transmitting signals, and it is not particularly limited.

In the first mode, the first signal line DL1 receives a first voltage V1, the second signal DL2 receives a second voltage V2, and the second control circuit C2 turns off the LED d21 and the fourth LED d22. In the second mode, the first signal line DL1 and the second signal DL2 receive the first voltage V1, the second control circuit C2 turns on the LED d21 and/or the LED d22.

According to embodiments, the first control circuit C1 may include a driving switch Tdri which includes a p-type transistor or an n-type transistor as described below.

Figure 3:
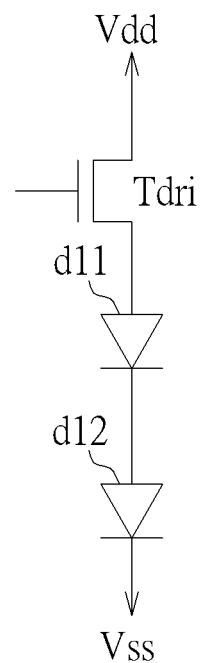
FIG. 3 and FIG. 4 illustrate couplings of the driving switch of the first control circuit and the LEDs of FIG. 2 according to embodiments.
Figure 4:
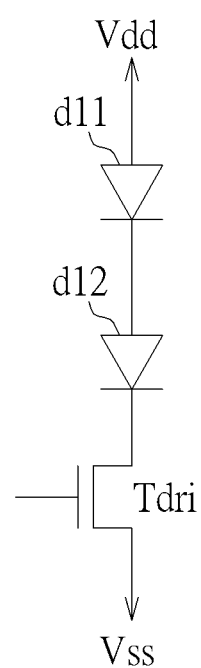

FIG. 3 and FIG. 4 illustrate couplings of the driving switch Tdri of the first control circuit C1 and the LEDs d11 and d12 of FIG. 2 according to embodiments.

As shown in FIG. 3, the LED d11 includes an anode and a cathode, and the LED d12 includes an anode and a cathode. The driving switch Tdri includes a first terminal for receiving a first reference voltage Vdd, a control terminal, and a second terminal coupled to the anode of the LED d11. The cathode of the LED d12 is used to receive a second reference voltage Vss. In the condition of FIG. 3, the driving switch Tdri may include a p-type transistor or an n-type transistor.

As shown in FIG. 4, the LED d11 includes an anode and a cathode, and the LED d12 includes an anode and a cathode. The anode of the LED d11 is used to receive the first reference voltage Vdd. The driving switch Tdri includes a first terminal coupled to the cathode of the LED d12, a control terminal, and a second terminal for receiving the second reference voltage Vss. In the condition of FIG. 4, the driving switch Tdri may include a p-type transistor.

Figure 5:
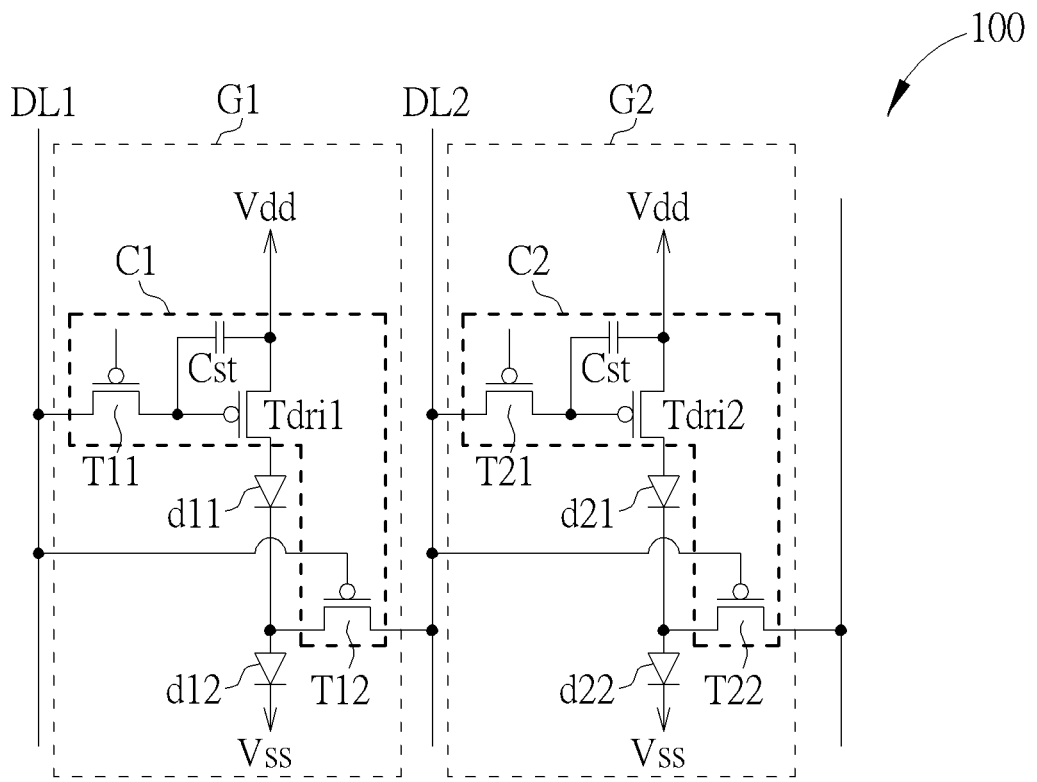
FIG. 5 illustrates the electric device of FIG. 2 with the coupling style shown in FIG. 3 according to an embodiment.

FIG. 5 illustrates the electric device 100 of FIG. 2 with the coupling style shown in FIG. 3 according to an embodiment. The first control circuit C1 may include the driving switch Tdri1, the first switch T11 and the second switch T12. The driving switch Tdri1 includes a control terminal, a first terminal and a second terminal. The first terminal and the second terminal of the driving switch Tdri1 may be coupled to the LED d11 and the LED d12 in series using the coupling style of FIG. 3. The first switch T11 may be coupled between the control terminal of the driving switch Tdri1 and the first signal line DL1. The second switch T12 may include a first terminal, a second terminal and a control terminal, where the first terminal is coupled to the LED d11 and the LED d12, the control terminal is coupled to the first signal line DL1, and the second terminal is coupled to the second signal line DL2. As shown in FIG. 5, a capacitor Cst may be coupled between the first terminal and the control terminal of the driving switch Tdri1. FIG. 5 merely provides an example, and the driving switch Tdri1 may be formed using a plurality of transistors coupled in parallel to have a sufficient driving current. When multiple transistors are coupled in parallel, the first terminals of the transistors are coupled together, the control terminals of the transistors are coupled together, and the second terminals of the transistors are coupled together so as to form the driving switch Tdri1. In the structure of FIG. 5, a path from the first reference voltage Vdd to the second reference voltage Vss may pass through the driving switch Tdri1 first and then pass through the LEDs d11 and d22, so the structure may be a "downside" structure. According to an embodiment, each LED in FIG. 5 may be an organic light-emitting diode (OLED) since the structure is suitable to match work functions. The driving switches Tdri1 and Tdri2 may correspond to the driving switch Tdri in FIG. 3.

Table 1 is an operation table of the electric device 100 of FIG. 5. The electric device 100 may have a matrix structure, so Table 1 may describe the operation of the first group G1 corresponding to the state of the adjacent second group G2. The operation of other groups of the matrix structure can be deduced according to Table 1 and FIG. 5.

TABLE 1

|  | First group G1 | Second group G2 | LED d11 | LED d12 | First switch T11 | Driving switch Tdri1 | Second switch T12 |
| --- | --- | --- | --- | --- | --- | --- | --- |
| Condition PD1 | Bright state | Dark state | Off (dark) | On (bright) | On | On | On |
| Condition PD2 | Bright state | Bright state | On (bright) | On (bright) | On | On | Off |
| Condition PD3 | Dark state | Bright state | Off (dark) | Off (dark) | On | Off | Off |
| Condition PD4 | Dark state | Dark state | Off (dark) | Off (dark) | On | Off | Off |

As described in Table 1, in FIG. 5, there are four conditions PD1 to PD4 according to the bright state and the dark state of the first group G1 and the second group G2, where the condition PD1 may correspond to the abovementioned first mode, and the condition PD2 may correspond to the abovementioned second mode. In the tables of the text herein and below, an "on" state may be an enabled state, and an "on" state may include keeping the on state or entering the on state from an off state instead of limiting to entering the on state from the off state. A transistor is in an on state as long as it is enabled at the time. Likewise, in the tables of the text herein and below, an "off" state may be a disabled state, and an "off" state may include keeping the off state or entering the off state from an on state without specific limitations in the text. A transistor is in an off state as long as it is disabled at the time.

As shown in FIG. 5, for example, the first reference voltage Vdd may be 10 volts, the second reference voltage Vss may be −5 volts, the first voltage V1 may be 7 volts and the second voltage V2 may be 10 volts. A threshold voltage Vt of each of the transistors of FIG. 5 may be −3 volts and a threshold voltage Vt of each of the diodes of FIG. 5 may be 3 volts. In the condition PD1, the first signal line DL1 receives the first voltage V1 (i.e. 7 volts), and the second signal line DL2 receives the second voltage (i.e. 10 volts). Hence, the second switch T12 may be enabled, and the anode of the LED d12 may receive 10 volts. As shown in Table 1, the first switch T11 may be enabled. At the time, because a gate-source voltage is sufficiently high, the driving switch Tdri1 is enabled. However, because the voltage across the two terminals of the LED d11 is insufficient, no current flows through the LED d11 substantially. In other words, although the driving switch Tdri1 is enabled, no current flows through the driving switch Tdri1 substantially. Hence, in the condition PD1, the LED d11 may be turned off, and merely the LED d12 is enabled. The light interference caused by the group G1 to affect the group G2 may be reduced. Each switch in FIG. 5 may include a p-type transistor.

Figure 6:
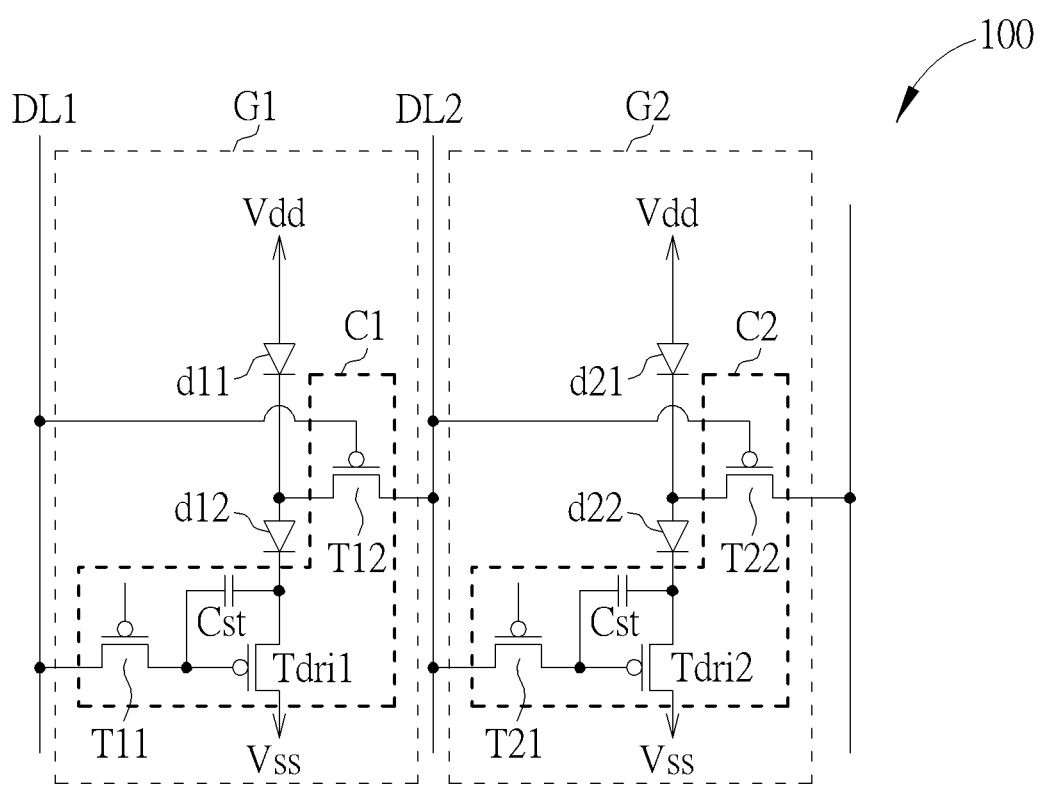
FIG. 6 illustrates the electric device of FIG. 2 with the coupling style shown in FIG. 4 according to an embodiment.

FIG. 6 illustrates the electric device 100 of FIG. 2 with the coupling style shown in FIG. 4 according to an embodiment. The first control circuit C1 may include the driving switch Tdri1, the first switch T11 and the second switch T12. The driving switch Tdri1 may include a control terminal, a first terminal and a second terminal. The first terminal and the second terminal of the driving switch Tdri1 may be coupled to the LED d11 and the LED d12 in series using the coupling style of FIG. 4. As shown in FIG. 6, a capacitor Cst may be coupled between the first terminal and the control terminal of the driving switch Tdri1. The first switch T11 may be coupled between the control terminal of the driving switch Tdri1 and the first signal line DL1. The second switch T12 may include a first terminal, a second terminal and a control terminal, where the first terminal is coupled to the LED d11 and the LED d12, the control terminal is coupled to the first signal line DL1, and the second terminal is coupled to the second signal line DL2. FIG. 6 merely provides an example, and the driving switch Tdri1 may be formed using a plurality of transistors coupled in parallel as described above for obtaining a sufficient driving current. In the structure of FIG. 6, a path from the first reference voltage Vdd to the second reference voltage Vss may pass through the LEDs d11 and d12 first and then pass through the driving switch Tdri1, so it may be an "upside" structure. The driving switches Tdri1 and Tdri2 may correspond to the driving switch Tdri in FIG. 4.

Table 2 is an operation table of the electric device 100 of FIG. 6. The electric device 100 may have a matrix structure, so Table 2 may describe the operation of the first group G1 corresponding to the state of the adjacent second group G2. The operation of other groups of the matrix structure may be deduced according to Table 2 and FIG. 6.

the second voltage V2 may be 13 volts. A threshold voltage Vt of each of the transistors of FIG. 6 may be −3 volts and a threshold voltage Vt of each of the diodes of FIG. 6 may be 3 volts. In the condition PU1, the first signal line DL1 may receive the first voltage V1 (i.e. 5 volts), and the second signal line DL2 may receive the second voltage (i.e. 13 volts). Hence, the second switch T12 may be enabled, and the anode of the LED d12 may receive 13 volts. Regarding a voltage across the LED d12 may be 3 volts, the cathode of the LED d12 may have a voltage of 10 volts at the time. As shown in Table 2, the first switch T11 may be enabled, and the control terminal of the driving switch Tdri1 may receive the first voltage V1 (i.e., 5 volts) from the first signal line DL1. The driving switch Tdri1 may hence be enabled, and a current may flow through the LED d12 and the driving switch Tdri1. Because the anode of the LED d12 may receive the second voltage (i.e., 13 volts), and the anode of the LED d11 may receive a voltage of 14 volts, the voltage across the LED d11 may be less than the threshold voltage Vt, and the LED d11 may fail to emit light. Hence, in the condition PU1, merely the LED d12 is enabled for emitting light, and the light interference caused by the first group G1 to affect the second group G2 may be reduced. Each switch of FIG. 5 may include a p-type transistor.

Figure 7:
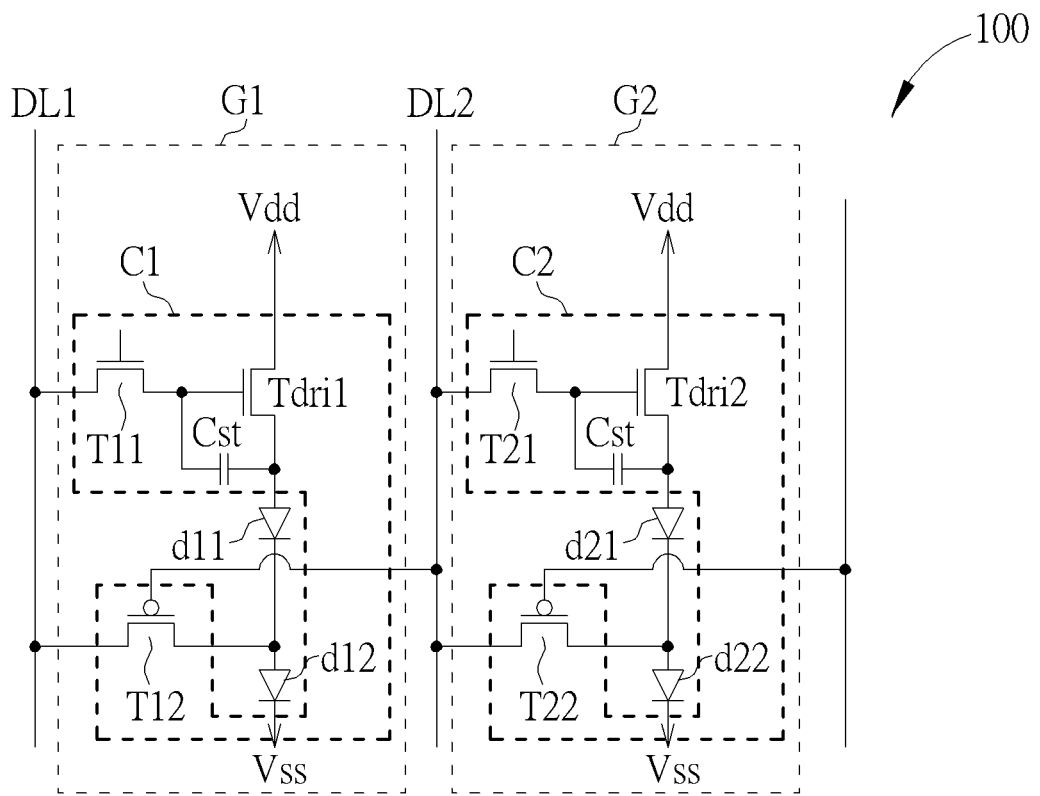
FIG. 7 illustrates the electric device of FIG. 2 with the coupling style shown in FIG. 3 according to an embodiment.

FIG. 7 illustrates the electric device 100 of FIG. 2 with the coupling style shown in FIG. 3 according to an embodiment. The first control circuit C1 may include the driving switch Tdri1, the first switch T11 and the second switch T12. The driving switch Tdri1 may include a control terminal, a first terminal and a second terminal. The first terminal and the second terminal of the driving switch Tdri1 may be coupled to the LED d11 and the LED d12 in series using the coupling style of FIG. 3. As shown in FIG. 7, a capacitor Cst may be coupled between the second terminal and the control terminal of the driving switch Tdri1. The first switch T11 may be coupled between the control terminal of the driving switch Tdri1 and the first signal line DL1. The second switch T12 may include a first terminal, a second terminal and a control terminal, where the first terminal may be coupled to the LED d11 and the LED d12, the second terminal may be coupled to the first signal line DL1, and the control terminal may be coupled to the second signal line DL2. FIG. 7 merely provides an example, and the driving switch Tdri1 may be

TABLE 2

|  | First group G1 | Second group G2 | LED d11 | LED d12 | First switch T11 | Driving switch Tdri1 | Second switch T12 |
| --- | --- | --- | --- | --- | --- | --- | --- |
| Condition PU1 | Bright state | Dark state | Off (dark) | On (bright) | On | On | On |
| Condition PU2 | Bright state | Bright state | On (bright) | On (bright) | On | On | Off |
| Condition PU3 | Dark state | Bright state | Off (dark) | Off (dark) | On | Off | Off |
| Condition PU4 | Dark state | Dark state | Off (dark) | Off (dark) | On | Off | Off |

As described in Table 2, in FIG. 6, there are four conditions PU1 to PU4 according to the bright state and the dark state of the first group G1 and the second group G2, where the condition PU1 may correspond to the abovementioned first mode, and the condition PU2 may correspond to the abovementioned second mode.

As shown in FIG. 6, for example, the first reference voltage Vdd may be 14 volts, the second reference voltage Vss may be −5 volts, the first voltage V1 may be 5 volts and formed using a plurality of transistors coupled in parallel as described above for obtaining a sufficient driving current.

Table 3 is an operation table of the electric device 100 of FIG. 7. The electric device 100 may have a matrix structure, so Table 3 may describe the operation of the first group G1 corresponding to the state of the adjacent second group G2. The operation of other groups of the matrix structure may be deduced according to Table 3 and FIG. 7.

TABLE 3

| | First group G1 | Second group G2 | LED d11 | LED d12 | First switch T11 | Driving switch Tdri1 | Second switch T12 |
|---|---|---|---|---|---|---|---|
| Condition PN1 | Bright state | Dark state | Off (dark) | On (bright) | On | Off | On |
| Condition PN2 | Bright state | Bright state | On (bright) | On (bright) | On | On | Off |
| Condition PN3 | Dark state | Bright state | Off (dark) | Off (dark) | On | Off | Off |
| Condition PN4 | Dark state | Dark state | Off (dark) | Off (dark) | On | Off | Off |

As shown in FIG. 7, for example, the first reference voltage Vdd may be 15 volts, the second reference voltage Vss may be −3 volts, the first voltage V1 may be 10 volts and the second voltage V2 may be 5 volts. A threshold voltage Vt of each of the transistors of FIG. 7 may be 3 volts and a threshold voltage Vt of each of the diodes of FIG. 7 may be 3 volts. In Table 3, the condition PN1 may correspond to the abovementioned first mode, and the condition PN2 may correspond to the abovementioned second mode. In FIG. 7, the driving switch Tdri1 and the first switch T11 may include n-type transistors, and the second switch T12 may include a p-type transistor. In the condition PN1, the first signal line DL1 may receive the first voltage V1 (i.e. 10 volts), and the second signal line DL2 may receive the second voltage (i.e. 5 volts). Hence, the second switch T12 may be enabled, and the anode of the LED d12 and the cathode of the LED d11 may receive the first voltage V1 (10 volts). As shown in Table 3, the first switch T11 may be enabled, and the control terminal of the driving switch Tdri1 may receive the first voltage V1 (i.e. 10 volts) from the first signal line DL1. Hence, a gate-source voltage of the driving switch Tdri1 may be insufficient to enable the driving switch Tdri1 so that, after entering a stable state, the driving switch Tdri1 may be turned off and no current may flow through the LED d11. However, the voltage across the LED d12 may be sufficient to enable the LED d12. Hence, in the condition PN1, merely the LED d12 may be enabled to emit light, and the light interference caused by the first group G1 to affect the second group G2 may be reduced.

Figure 8:
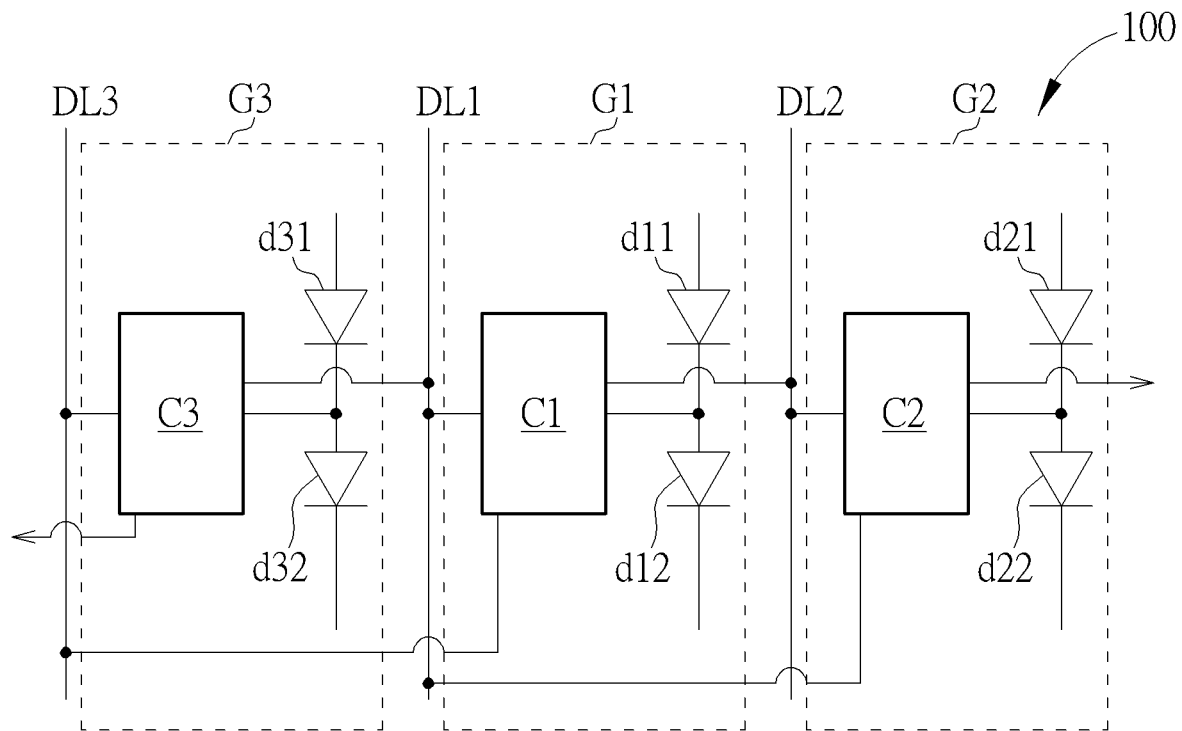
FIG. 8 illustrates that the electric device of FIG. 2 further includes a third group according to another embodiment.

FIG. 8 illustrates that the electric device 100 of FIG. 2 further includes a third group G3 according to another embodiment. The third group G3 may be disposed adjacent to the first group G1. The first group G1 may be disposed between the third group G3 and the second group G2. In the abovementioned first mode, the first group G1 may be in the bright state, and the second group G2 and/or the third group G3 may be in the dark state. In the abovementioned second mode, the first group G1, the second group G2 and the third group G3 may be in the bright state.

As shown in FIG. 8, the electric device 100 may further include a third signal line DL3 coupled to the third group G3. The third group G3 may include an LED d31 (a fifth LED), an LED d32 (a sixth LED) and a third control circuit C3, where the LED d31 and the LED d32 are coupled in series. The third control circuit C3 may be used to control the LEDs d31 and d32. In the abovementioned first mode, the first signal line DL1 may receive a first voltage V1, and the second signal line DL2 and/or the third signal line DL3 may receive a second voltage V2. In the abovementioned second mode, the first signal line DL1, the second signal line DL2 and the third signal line DL3 may receive the first voltage V1. In FIG. 8, merely a portion of couplings of the first control circuit C1, the second control circuit C2 and the third control circuit C3 are shown. More details related to the first control circuit C1, the second control circuit C2 and the third control circuit C3 are described below.

Figure 9:
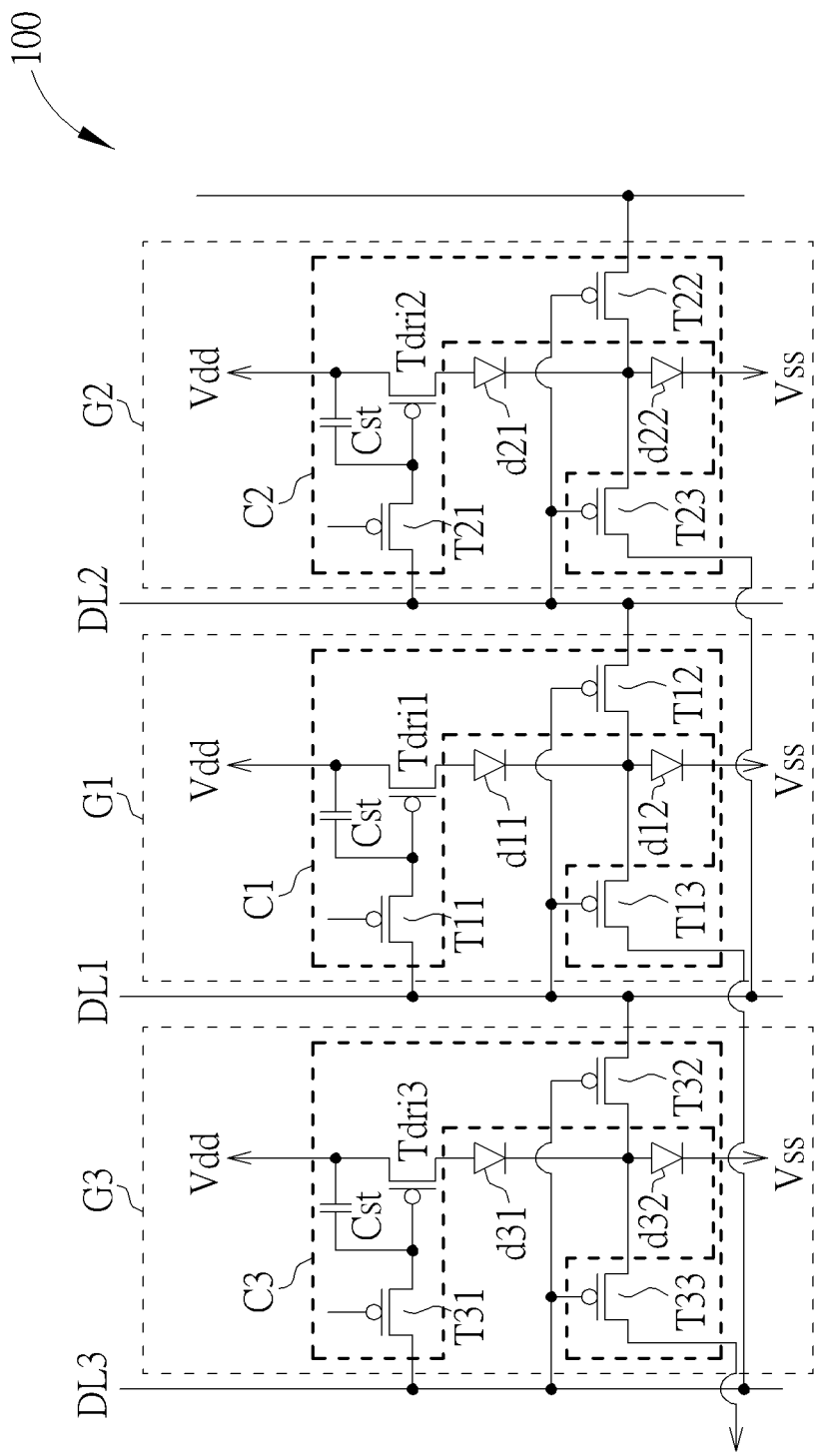
FIG. 9 illustrates the electric device of FIG. 8 on the basis of the circuit of FIG. 5 according to an embodiment.

FIG. 9 illustrates the electric device 100 of FIG. 8 on the basis of the circuit of FIG. 5 according to an embodiment. The similarities of FIG. 9 and FIG. 5 are not descried repeatedly. As shown in FIG. 9 and FIG. 5, the first group G1 of FIG. 9 may further include a third switch T13. The third switch T13 may include a first terminal, a second terminal and a control terminal where the first terminal may be coupled to the third signal line DL3, the control terminal may be coupled to the first signal line DL1, and the second terminal may be coupled to the LED d11 and the LED d12. Because the electric device 100 may have a matrix structure, the structures of the second group G2 and the third group G3 may be similar to the structure of the first group G1, and the structures are not described repeatedly.

Table 4 is an operation table of the electric device 100 of FIG. 9. The electric device 100 may have a matrix structure, so Table 4 may describe the operation of the first group G1 corresponding to the states of the adjacent second group G2 and the third group G3. The operation of other groups of the matrix structure may be deduced according to Table 4 and FIG. 9. In Table 4, the conditions PD31 to PD38 may be defined by the eight combinations of the bright state and the dark state of the first group G1, the second group G2 and the third group G3. The conditions PD31, PD32 and PD34 may correspond to the abovementioned first mode. The condition PD33 may correspond to the abovementioned second mode.

TABLE 4

| | Third group G3 | First group G1 | Second group G2 | LED d11 | LED d12 |
|---|---|---|---|---|---|
| Condition PD31 | Bright state | Bright state | Dark state | Off (dark) | On (bright) |
| Condition PD32 | Dark state | Bright state | Dark state | Off (dark) | On (bright) |
| Condition PD33 | Bright state | Bright state | Bright state | On (bright) | On (bright) |
| Condition PD34 | Dark state | Bright state | Bright state | Off (dark) | On (bright) |
| Condition PD35 | Bright state | Dark state | Bright state | Off (dark) | Off (dark) |
| Condition PD36 | Dark state | Dark state | Bright state | Off (dark) | Off (dark) |
| Condition PD37 | Bright state | Dark state | Dark state | Off (dark) | Off (dark) |
| Condition PD38 | Dark state | Dark state | Dark state | Off (dark) | Off (dark) |

The switches of the first group G1 of FIG. 9

| | First switch T11 | Driving switch Tdri1 | Third switch T13 | Second switch T12 |
|---|---|---|---|---|
| Condition PD31 | on | on | off | on |
| Condition PD32 | on | on | on | on |

TABLE 4-continued

| | | | | |
|---|---|---|---|---|
| Condition PD33 | on | on | off | off |
| Condition PD34 | on | on | on | off |
| Condition PD35 | on | off | off | off |
| Condition PD36 | on | off | off | off |
| Condition PD37 | on | off | off | off |
| Condition PD38 | on | off | off | off |

The switches of the second group G2 of FIG. 9

| | First switch T21 | Driving switch Tdri2 | Third switch T23 | Second switch T22 |
|---|---|---|---|---|
| Condition PD31 | on | off | off | — |
| Condition PD32 | on | off | off | — |
| Condition PD33 | on | on | off | — |
| Condition PD34 | on | on | off | — |
| Condition PD35 | on | on | on | — |
| Condition PD36 | on | on | on | — |
| Condition PD37 | on | off | off | — |
| Condition PD38 | on | off | off | — |

The switches of the third group G3 of FIG. 9

| | First switch T31 | Driving switch Tdri3 | Third switch T33 | Second switch T32 |
|---|---|---|---|---|
| Condition PD31 | on | on | — | off |
| Condition PD32 | on | off | — | off |
| Condition PD33 | on | on | — | off |
| Condition PD34 | on | off | — | off |
| Condition PD35 | on | on | — | on |
| Condition PD36 | on | off | — | off |
| Condition PD37 | on | on | — | on |
| Condition PD38 | on | off | — | off |

Regarding FIG. 9 and Table 4, for example, the first reference voltage Vdd may be 10 volts, the second reference voltage Vss may be −5 volts, the first voltage V1 may be 7 volts, and the second voltage V2 may be 10 volts. A threshold voltage Vt of each of the transistors of FIG. 9 may be −3 volts and a threshold voltage Vt of the each of the diodes of FIG. 9 may be 3 volts. Each switch may include a p-type transistor as an example. In order to deal with the problem of light interference, the conditions of the first group G1 in the bright state, and the second group G2 and/or the third group G3 in the dark state (i.e. the conditions PD31, PD32 and PD34 of Table 4) are described below.

In the condition PD31, the first signal line DL1 and the third signal line DL3 may receive the first voltage V1 (e.g., 7 volts) and the second signal line DL2 may receive the second voltage V2 (e.g., 10 volts). Since the first switch T11 is enabled, the control terminal of the driving switch Tdri1 may receive the first voltage V1. The control terminals of the second switch T12 and the third switch T13 may receive the second voltage V1 (7 volts). Since the second terminal of the second switch T12 may receive 10 volts, the second switch T12 may be enabled because the voltage between the control terminal and the second terminal may reach the threshold voltage. The first terminal of the third switch T13 may receive a voltage of 7 volts from the third signal DL3, and the third switch T13 may be turned off since the voltage between the terminals of the third switch T13 fails to reach the threshold voltage. Like the condition PD1 of FIG. 5 and Table 1, the anode of the LED d12 may receive a voltage of 10 volts. At the time, a gate-source voltage of the driving switch Tdri1 is sufficient, so the driving switch Tdri1 is enabled. However, the voltage across the LED d11 may be insufficient, so no current may flow through the LED d11. In other words, the driving switch Tdri1 may be enabled without a current flowing through the driving switch Tdri1. Hence, in the condition PD31, merely the LED d12 is enabled, and the LED d11 may be turned off. As a result, the light interference caused by the first group G1 to affect the second group G2 may be reduced, the number of enable LEDs may be decreased when displaying specific pictures, life time of LEDs may be increased, and power consumption may be reduced.

In the condition PD32, the first signal line DL1 may receive the first voltage V1 (e.g., 7 volts), and the second signal line DL2 and the third signal line DL3 may receive the second voltage V2 (e.g., 10 volts). Since the first switch T11 is enabled, the control terminal of the driving switch Tdri1 may receive the first voltage V1. The control terminals of the second switch T12 and the third switch T13 may receive the first voltage V1 (7 volts). Since the second terminal of the second switch T12 and the first terminal of the third switch T13 may receive a voltage of 10 volts, the second switch T12 and the third switch T13 may be enabled because the voltage between the terminals of each of the switches T12 and T13 may reach the threshold voltage. The anode of the LED d12 may receive a voltage of 10 volts. At the time, a gate-source voltage of the driving switch Tdri1 is sufficient, so the driving switch Tdri1 may be enabled. However, the voltage across the LED d11 may be insufficient, so no current may flow through th LED d11. In other words, the driving switch Tdri1 may be enabled without a current flowing through the driving switch Tdri1. Hence, in the condition PD32, merely the LED d12 is enabled, and the LED d11 may be turned off. As a result, the light interference caused by the first group G1 to affect the second group G2 and the third group G3 may be reduced, the number of enabled LEDs may be decreased when displaying specific pictures, life time of LEDs may be increased, and power consumption may be reduced.

The principle of the operation of the switches in the condition PD34 may be similar to that in the condition PD31, but the states of the second switch T12 and the third switch T13 may be exchanged with one another. In other words, the third switch T13 may be enabled, the second switch T12 may be turned off, the LED d12 may be enabled, and the LED d11 may be turned off. The interference caused by the light of the first group G1 to affect the third group G3 may be reduced.

Figure 10:
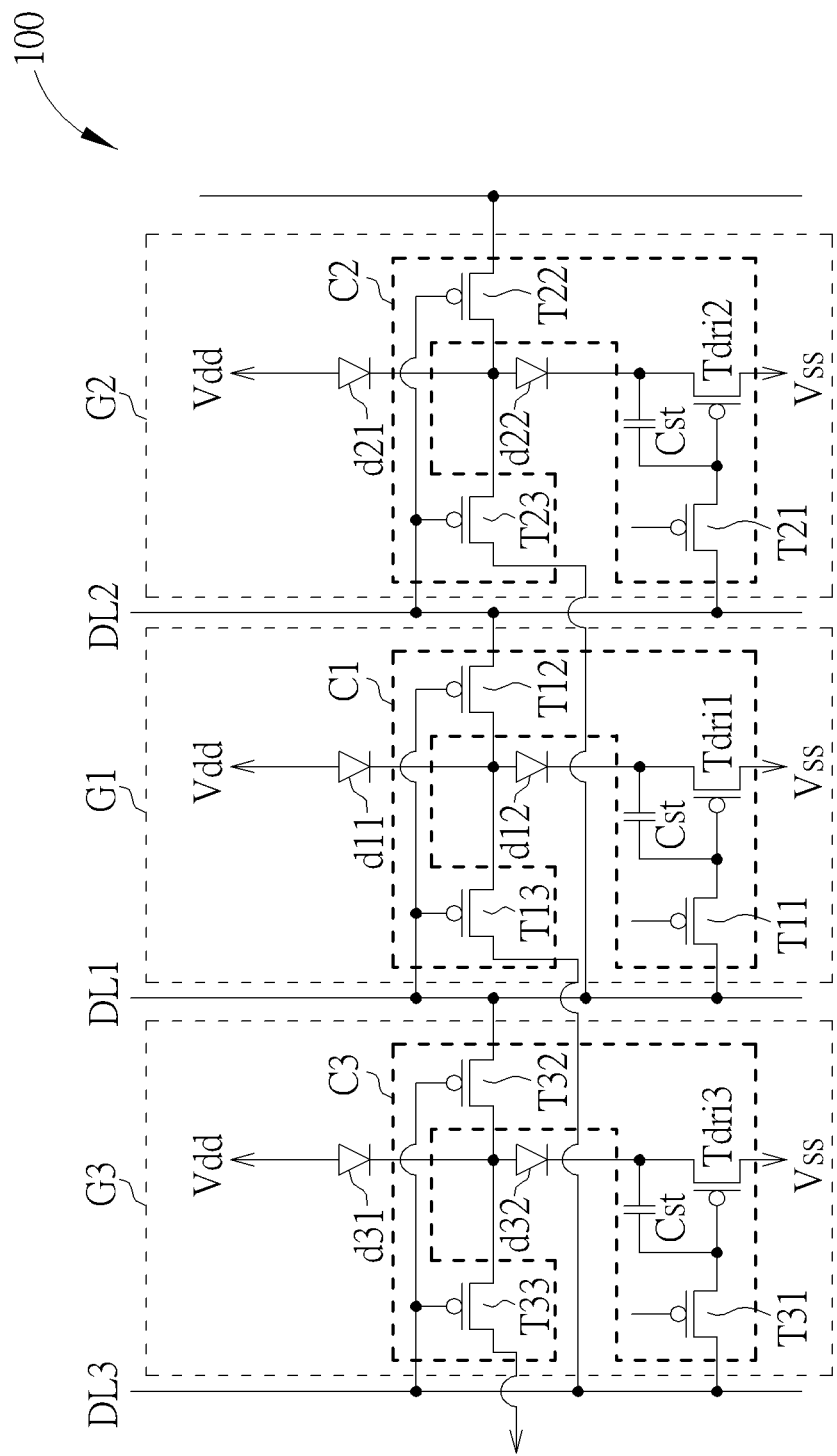
FIG. 10 illustrates the electric device of FIG. 8 on the basis of the circuit of FIG. 6 according to an embodiment.

FIG. 10 illustrates the electric device 100 of FIG. 8 on the basis of the circuit of FIG. 6 according to an embodiment. The similarities of FIG. 10 and FIG. 6 are not descried repeatedly. As shown in FIG. 10 and FIG. 6, the first group G1 of FIG. 10 may further include a third switch T13. The third switch T13 may include a first terminal, a second terminal and a control terminal, where the first terminal may be coupled to the third signal line DL3, the control terminal may be coupled to the first signal line DL1, and the second terminal may be coupled to the LED d11 and the LED d12. Because the electric device 100 may have a matrix structure, the structures of the second group G2 and the third group G3 may be similar to the structure of the first group G1, and the structures are not described repeatedly.

Table 5 is an operation table of the electric device 100 of FIG. 10. The electric device 100 may have a matrix structure, so Table 5 may describe the operation of the first group G1 corresponding to the states of the adjacent second group G2 and the third group G3. The operation of other groups of the matrix structure may be deduced according to Table 5 and FIG. 10. In Table 5, the conditions PU31 to PU38 may be defined by the eight combinations of the bright state and the dark state of the first group G1, the second group G2 and the third group G3. The conditions PU31, PU32 and PU34 may correspond to the abovementioned first mode. The condition PU33 may correspond to the abovementioned second mode.

TABLE 5

|  | Third group G3 | First group G1 | Second group G2 | LED d11 | LED d12 |
|---|---|---|---|---|---|
| Condition PU31 | Bright state | Bright state | Dark state | Off (dark) | On (bright) |
| Condition PU32 | Dark state | Bright state | Dark state | Off (dark) | On (bright) |
| Condition PU33 | Bright state | Bright state | Bright state | On (bright) | On (bright) |
| Condition PU34 | Dark state | Bright state | Bright state | Off (dark) | On (bright) |
| Condition PU35 | Bright state | Dark state | Bright state | Off (dark) | Off (dark) |
| Condition PU36 | Dark state | Dark state | Bright state | Off (dark) | Off (dark) |
| Condition PU37 | Bright state | Dark state | Dark state | Off (dark) | Off (dark) |
| Condition PU38 | Dark state | Dark state | Dark state | Off (dark) | Off (dark) |

The switches of the first group G1 of FIG. 10

|  | First switch T11 | Driving switch Tdri1 | Third switch T13 | Second switch T12 |
|---|---|---|---|---|
| Condition PU31 | on | on | off | on |
| Condition PU32 | on | on | on | on |
| Condition PU33 | on | on | off | off |
| Condition PU34 | on | on | on | off |
| Condition PU35 | on | off | off | off |
| Condition PU36 | on | off | off | off |
| Condition PU37 | on | off | off | off |
| Condition PU38 | on | off | off | off |

The switches of the second group G2 of FIG. 10

|  | First switch T21 | Driving switch Tdri2 | Third switch T23 | Second switch T22 |
|---|---|---|---|---|
| Condition PU31 | on | off | off | — |
| Condition PU32 | on | off | off | — |
| Condition PU33 | on | on | off | — |
| Condition PU34 | on | on | off | — |
| Condition PU35 | on | on | on | — |
| Condition PU36 | on | on | on | — |
| Condition PU37 | on | off | off | — |
| Condition PU38 | on | off | off | — |

The switches of the third group G3 of FIG. 10

|  | First switch T31 | Driving switch Tdri3 | Third switch T33 | Second switch T32 |
|---|---|---|---|---|
| Condition PU31 | on | on | — | off |
| Condition PU32 | on | off | — | off |
| Condition PU33 | on | on | — | off |
| Condition PU34 | on | off | — | off |
| Condition PU35 | on | on | — | on |
| Condition PU36 | on | off | — | off |
| Condition PU37 | on | on | — | on |
| Condition PU38 | on | off | — | off |

Regarding FIG. 10 and Table 5, for example, the first reference voltage Vdd may be 14 volts, the second reference voltage Vss may be −5 volts, the first voltage V1 may be 5 volts, and the second voltage V2 may be 13 volts. A threshold voltage Vt of each of the transistors of FIG. 10 may be 3 volts and a threshold voltage Vt of each of the diodes of FIG. 10 may be 3 volts. Each switch may include a p-type transistor as an example. In order to deal with the problem of light interference, the conditions of the first group G1 in the bright state, and the second group G2 and/or the third group G3 in the dark state (i.e., the conditions PU31, PU32 and PU34 of Table 5) are described below.

In the condition PU31, the first signal line DL1 and the third signal line DL3 may receive the first voltage V1 (e.g., 5 volts) and the second signal line DL2 may receive the second voltage V2 (e.g., 13 volts). Since the first switch T11 is enabled, the control terminal of the driving switch Tdri1 may receive the first voltage V1. The control terminals of the second switch T12 and the third switch T13 may receive the second voltage V1 (5 volts). Since the second terminal of the second switch T12 may receive a voltage of 13 volts, the second switch T12 may be enabled because the voltage between the terminals may reach the threshold voltage. The first terminal of the third switch T13 may receive a voltage of 5 volts from the third signal line DL3, and the third switch T13 may be turned off since the voltage between the terminals of the third switch T13 fails to reach the threshold voltage. Like the condition PU1 of FIG. 6 and Table 2, the anode of the LED d12 may receive a voltage of 13 volts, and the cathode of the LED d12 may have a voltage of 10 volts. At the time, a gate-source voltage of the driving switch Tdri1 is sufficient, so the driving switch Tdri1 may be enabled. However, the voltage across the LED d11 may be insufficient, so no current may flow through the LED d11. In other words, in the condition PU31, merely the LED d12 may be enabled, and the LED d11 may be turned off. As a result, the light interference caused by the first group G1 to affect the second group G2 may be reduced, the number of enable LEDs may be decreased when displaying specific pictures, life time of LEDs may be increased, and power consumption may be reduced.

In the condition PU32, the first signal line DL1 may receive the first voltage V1 (e.g., 5 volts), and the second signal line DL2 and the third signal line DL3 may receive the second voltage V2 (e.g., 13 volts). Since the first switch T11 is enabled, the control terminal of the driving switch Tdri1 may receive the first voltage V1. The control terminals of the second switch T12 and the third switch T13 may receive the first voltage V1 (5 volts). Since the second terminal of the second switch T12 and the first terminal of the third switch T13 may receive a voltage of 13 volts, the second switch T12 and the third switch T13 may be enabled because the voltage between the terminals of each of the switches T12 and T13 may reach the threshold voltage. The anode of the LED d12 may receive a voltage of 10 volts. At the time, a gate-source voltage of the driving switch Tdri1 is sufficient, so the driving switch Tdri1 may be enabled. However, the voltage across the LED d11 may be insufficient, so no current may flow through th LED d11. In other words, in the condition PU32, merely the LED d12 is enabled, and the LED d11 may be turned off. As a result, the light interference caused by the first group G1 to affect the second group G2 and the third group G3 may be reduced.

The principle of the operation of the switches in the condition PU34 may be similar to that in the condition PU31, but the states of the second switch T12 and the third switch T13 may be exchanged with one another. In other words, the third switch T13 may be enabled, the second switch T12 may be turned off, the LED d12 may be enabled, and the LED d11 may be turned off. The interference caused by the light of the first group G1 to affect the third group G3 may be reduced.

Figure 11:
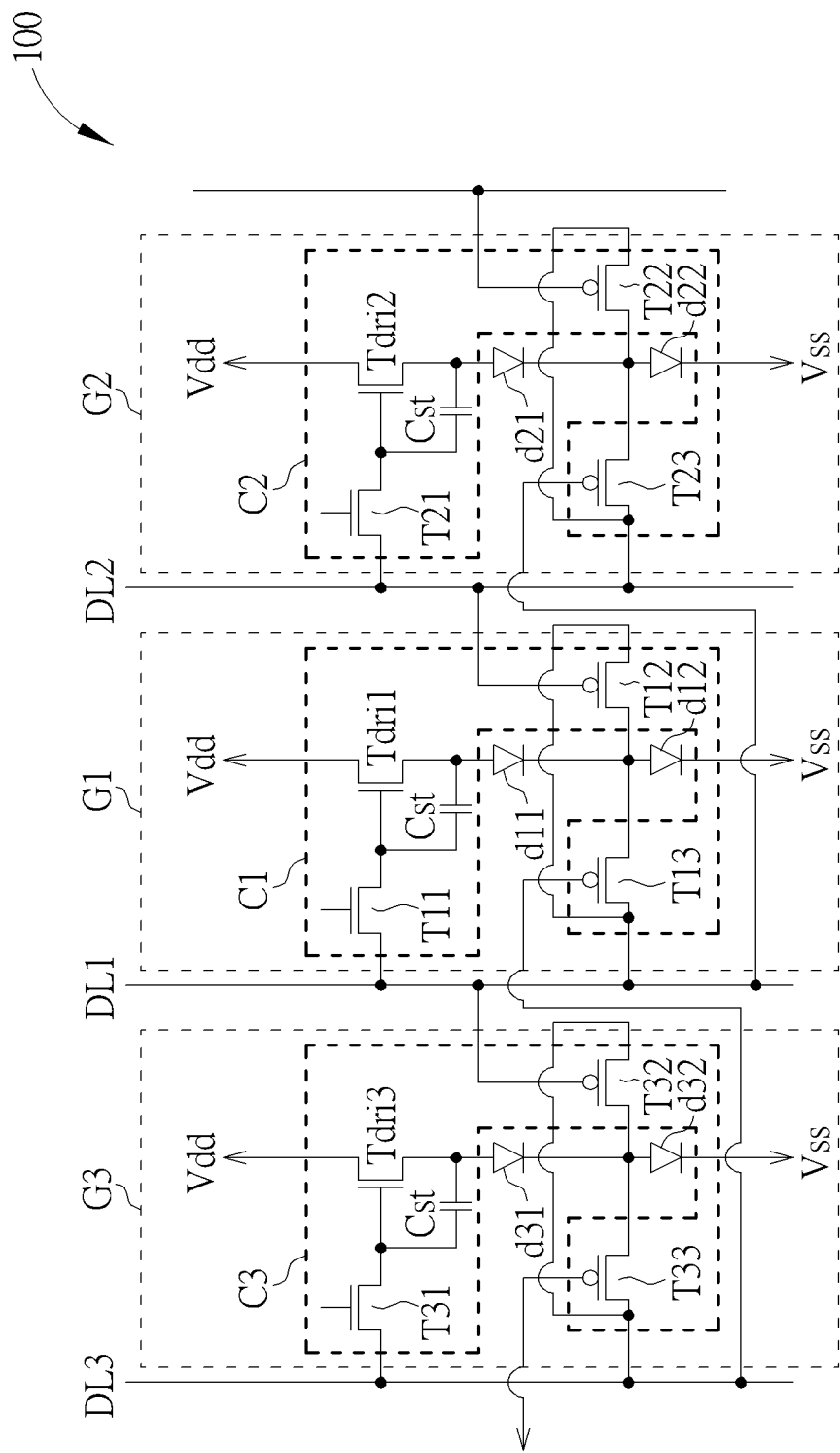
FIG. 11 illustrates the electric device of FIG. 8 on the basis of the circuit of FIG. 7 according to an embodiment.

FIG. 11 illustrates the electric device 100 of FIG. 8 on the basis of the circuit of FIG. 7 according to an embodiment. The similarities of FIG. 11 and FIG. 7 are not descried repeatedly. As shown in FIG. 11 and FIG. 7, the first group G1 of FIG. 11 may further include a second switch T12 with a different configuration and a third switch T13. The second switch T12 may include a first terminal coupled to the LED d11 and the LED d12, a control terminal coupled to the second signal line DL2, and a second terminal coupled to the first signal line DL1. The third switch T13 may include a first terminal, a second terminal and a control terminal, where the first terminal may be coupled to the first signal line DL1, the second terminal may be coupled to the LED d11 and the LED d12, and the control terminal may be coupled to the third signal line DL3. Because the electric device 100 may have a matrix structure, the structures of the second group G2 and the third group G3 may be similar to the structure of the first group G1, and the structures are not described repeatedly.

Table 6 is an operation table of the electric device 100 of FIG. 11. The electric device 100 may have a matrix structure, so Table 6 may describe the operation of the first group G1 corresponding to the states of the adjacent second group G2 and the third group G3. The operation of other groups of the matrix structure may be deduced according to Table 6 and FIG. 11. In Table 6, the conditions PN31 to PN38 may be defined by the eight combinations of the bright state and the dark state of the first group G1, the second group G2 and the third group G3. The conditions PN31, PN32 and PN34 may correspond to the abovementioned first mode. The condition PN33 may correspond to the abovementioned second mode.

TABLE 6

| | Third group G3 | First group G1 | Second group G2 | LED d11 | LED d12 |
|---|---|---|---|---|---|
| Condition PN31 | Bright state | Bright state | Dark state | Off (dark) | On (bright) |
| Condition PN32 | Dark state | Bright state | Dark state | Off (dark) | On (bright) |
| Condition PN33 | Bright state | Bright state | Bright state | On (bright) | On (bright) |
| Condition PN34 | Dark state | Bright state | Bright state | Off (dark) | On (bright) |
| Condition PN35 | Bright state | Dark state | Bright state | Off (dark) | Off (dark) |
| Condition PN36 | Dark state | Dark state | Bright state | Off (dark) | Off (dark) |
| Condition PN37 | Bright state | Dark state | Dark state | Off (dark) | Off (dark) |
| Condition PN38 | Dark state | Dark state | Dark state | Off (dark) | Off (dark) |

The switches of the first group G1 of FIG. 11

| | First switch T11 | Driving switch Tdri1 | Third switch T13 | Second switch T12 |
|---|---|---|---|---|
| Condition PN31 | On | Off | Off | On |
| Condition PN32 | On | Off | On | On |
| Condition PN33 | On | On | Off | Off |
| Condition PN34 | On | Off | On | Off |
| Condition PN35 | On | Off | Off | Off |
| Condition PN36 | On | Off | Off | Off |
| Condition PN37 | On | Off | Off | Off |
| Condition PN38 | On | Off | Off | Off |

The switches of the second group G2 of FIG. 11

| | First switch T21 | Driving switch Tdri2 | Third switch T23 | Second switch T22 |
|---|---|---|---|---|
| Condition PN31 | On | Off | Off | — |
| Condition PN32 | On | Off | Off | — |
| Condition PN33 | On | On | Off | — |
| Condition PN34 | On | On | Off | — |
| Condition PN35 | On | On | On | — |
| Condition PN36 | On | On | On | — |
| Condition PN37 | On | Off | Off | — |
| Condition PN38 | On | Off | Off | — |

The switches of the third group G3 of FIG. 11

| | First switch T31 | Driving switch Tdri3 | Third switch T33 | Second switch T32 |
|---|---|---|---|---|
| Condition PN31 | On | On | — | Off |
| Condition PN32 | On | Off | — | Off |
| Condition PN33 | On | On | — | Off |
| Condition PN34 | On | Off | — | Off |

TABLE 6-continued

| | | | | |
|---|---|---|---|---|
| Condition PN35 | On | Off | — | On |
| Condition PN36 | On | Off | — | Off |
| Condition PN37 | On | Off | — | On |
| Condition PN38 | On | Off | — | Off |

Regarding FIG. 11 and Table 6, for example, the first reference voltage Vdd may be 15 volts, the second reference voltage Vss may be −3 volts, the first voltage V1 may be 10 volts, and the second voltage V2 may be 5 volts. A threshold voltage Vt of each of the transistors of FIG. 10 may be 3 volts and a threshold voltage Vt of each of the diodes of FIG. 10 may be 3 volts. For example, the driving switch Tdri1 and the first switch T11 may include n-type transistors, and the second switch T12 and the third switch T13 may include p-type transistors. In order to deal with the problem of light interference, the conditions of the first group G1 in the bright state, and the second group G2 and/or the third group G3 in the dark state (i.e., the conditions PN31, PN32 and PN34 of Table 6) are described below.

In the condition PN31, the first signal line DL1 and the third signal line DL3 may receive the first voltage V1 (e.g., 10 volts) and the second signal line DL2 may receive the second voltage V2 (e.g., 5 volts). Hence, the second switch T12 may be enabled, and the third switch T13 may be turned off. The anode of the LED d12 and the cathode of the LED d11 may receive a voltage of 10 volts. Since the first switch T11 is enabled, the control terminal of the driving switch Tdri1 may receive the first voltage V1 (10 volts). Hence, a gate-source voltage of the driving switch Tdri1 may be insufficient to drive the driving switch Tdri1, the driving switch Tdri1 may be turned off after entering a stable state, and there may be no current flowing through the LED d11. However, a voltage across the LED d12 may be sufficient to enable the LED d12. As a result, in the condition PN31, merely the LED d12 may be enabled in the first group G1, and the light interference caused by the first group G1 to affect the second group G2 may be reduced.

In the condition PN32, the first signal line DL1 may receive the first voltage V1 (e.g., 10 volts), and the second signal line DL2 and the third signal line DL3 may receive the second voltage V2 (e.g., 5 volts). Since the first switch T11 is enabled, the control terminal of the driving switch Tdri1 may receive the first voltage V1. The control terminals of the second switch T12 and the third switch T13 may receive the second voltage V2 (e.g., 5 volts). Since the second terminal of the second switch T12 and the first terminal of the third switch T13 may receive a voltage of 10 volts, the second switch T12 and the third switch T13 may be enabled because the voltage between the terminals of each of the switches T12 and T13 may reach the threshold voltage. The anode of the LED d12 may receive a voltage of 10 volts. At the time, a gate-source voltage of the driving switch Tdri1 is insufficient, so the driving switch Tdri1 may be turned off, and there is no current flowing through the LED d11. In other words, in the condition PU32, merely the LED d12 is enabled, and the LED d11 may be turned off. As a result, the light interference caused by the first group G1 to affect the second group G2 and the third group G3 may be reduced.

The principle of the operation of the switches in the condition PN34 may be similar to that in the condition PN31, but the states of the second switch T12 and the third switch T13 may be exchanged with one another. In other words, the third switch T13 may be enabled, the second switch T12 may be turned off, the LED d12 may be enabled, and the LED d11 may be turned off. The interference caused by the light of the first group G1 to affect the third group G3 may be reduced.

Figure 12:
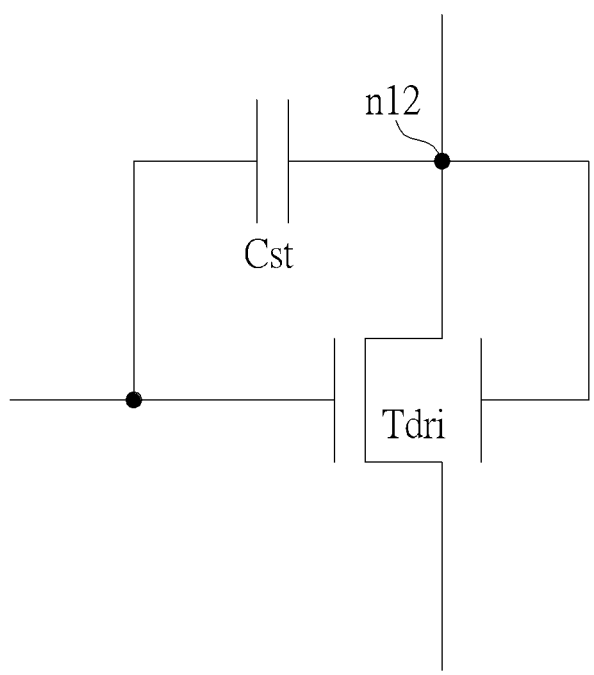
FIG. 12 illustrates a circuit of the driving switch of FIG. 5 to FIG. 7 and FIG. 9 to FIG. 11 according to embodiments.

FIG. 12 illustrates a circuit of the driving switch Tdri1 of FIG. 5 to FIG. 7 and FIG. 9 to FIG. 11 according to embodiments. The driving switch Tdri1 of FIG. 12 may include a p-type transistor or an n-type transistor. According to an embodiment, a plurality of transistors may be coupled together in parallel to form the driving switch Tdri1 as described above. As shown in FIG. 12, the driving switch Tdri1 of FIG. 5 to FIG. 7 and FIG. 9 to FIG. 11 may include a fourth (??) terminal component. For example, a double gate transistor may be used, where a first gate terminal may be the abovementioned control terminal of the driving switch, and a second gate terminal may correspond to a back channel of the transistor. As shown in FIG. 12, the second gate terminal may be coupled to the capacitor Cst shown in FIG. 5 to FIG. 7 and FIG. 9 to FIG. 11 to form a compensation path. The compensation path may be used for compensating the influence caused by the variation (A variance has a formula. I think a generic term of "variation" is more appropriate here) of the current flowing through the driving switch Tdri1, where the variation of the current may influence a voltage at the node 12, and the source-gate voltage of the driving switch Tdri1.

In summary, by means of an electric device provided by an embodiment, the light interference may be reduced where the light interference is caused by a group in a bright state to affect another group in a dark state when the two groups are adjacent to one another and respectively in the bright state and in the dark state. The number of enable LEDs may be decreased when displaying specific pictures. Life time of LEDs may be increased, and power consumption may be reduced. As described above, a solution is also provided to avoid light interference and decrease the number of enabled LEDs when displaying a specific picture for three adjacent groups. Regarding each of the abovementioned figures, although two LEDs in one group is shown to be coupled in series and placed along a vertical diction, this is merely an example. According to an embodiment, two LEDs of a same group may be placed along a horizontal direction and be coupled using the couplings of the embodiment when performing place and route (PnR) of the circuit. Each group described above may correspond to one pixel or a plurality of pixels. Components of one group may be formed on a same substrate, so a semiconductor process may be used to form the components. A transistor mentioned above may be a thin-film transistor (TFT). According to embodiments, the electric device mentioned above may be used with organic light-emitting diode (OLED), micro LED (mLED), flexible display, and so on. The light emitted by the abovementioned LED may be used as backlight of a liquid-crystal display (LCD) display. According to the grayscales of the pixels of an LCD display, every group may be set to a bright state or a dark state, and light interference may be prevented by means of a solution provided by an embodiment. Hence, the display performance and the contrast ratio can be effectively improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electric device comprising:
a first group comprising:
   a first LED and a second LED coupled in series; and
   a first control circuit coupled between the first LED and the second LED; and
a second group comprising:
   a third LED and a fourth LED coupled in series; and
   a second control circuit coupled between the third LED and the fourth LED;
a first signal line coupled to the first group;
a second signal line coupled to the second group;
wherein the second signal line further couples to the first control circuit such that when the first group is in a bright state and the second group is in a dark state, one of the first LED and the second LED is turned off, and the other one of the first LED and the second LED is turned on.

2. The electric device of claim 1, wherein:
the first signal line receives a first voltage, the second signal line receives a second voltage, the first control circuit enables one of the first LED and the second LED and disables the other one of the first LED and the second LED, and the second control circuit disables the third LED and the fourth LED in a first mode;
the first signal line and the second signal line receive the first voltage, the first control circuit enables the first LED and the second LED, and the second control circuit enables the third LED and the fourth LED in a second mode;
the first group is in the bright state and the second group is in the dark state in the first mode; and
the first group and the second group are in the bright state in the second mode.

3. The electric device of claim 2, further comprising a third group; wherein:
the third group is disposed adjacent to the first group;
the first group is disposed between the third group and the second group;
the first group is in the bright state, and the second group and/or the third group is in the dark state in the first mode; and
the first group, the second group and the third group are in the bright state in the second mode.

4. The electric device of claim 3, wherein:
the electric device further comprises a third signal line;
the third signal line is coupled to the third group;
the third group comprises a fifth LED, a sixth LED and a third control circuit;
the fifth LED and the sixth LED are coupled in series;
the third control circuit is configured to control the fifth LED and the sixth LED;
the first signal line receives the first voltage, the second signal line and/or the third signal line receives the second voltage in the first mode; and
the first signal line, the second signal line and the third signal line receive the first voltage in the second mode.

5. The electric device of claim 3, wherein the first control circuit comprises a driving switch comprising a p-type transistor.

6. The electric device of claim 3, wherein:
the electric device further comprises a third signal line;
the third signal line is coupled to the third group;
the third group comprises a fifth LED, a sixth LED and a third control circuit;
the fifth LED and the sixth LED are coupled in series;
the third control circuit is configured to control the fifth LED and the sixth LED;
the first control circuit comprises:
   a driving switch coupled to the first LED and the second LED in series;
   a first switch coupled between a control terminal of the driving switch and the first signal line;
   a second switch comprising a first terminal, a second terminal and a control terminal wherein the first terminal of the second switch is coupled between the first LED and the second LED, the control terminal of the second switch is coupled to the first signal line, and the second terminal of the second switch is coupled to the second signal line; and
   a third switch comprising a first terminal, a second terminal and a control terminal wherein the first terminal of the third switch is coupled to the third signal line, the control terminal of the third switch is coupled to the first signal line, and the second terminal of the third switch is coupled to the first LED and the second LED.

7. The electric device of claim 1, wherein the first control circuit comprises a driving switch comprising a p-type transistor.

8. The electric device of claim 7, wherein:
the first LED comprises an anode and a cathode;
the second LED comprises an anode and a cathode;
the driving switch comprises a first terminal, a second terminal and a control terminal;
the first terminal of the driving switch is configured to receive the a first reference voltage;
the second terminal of the driving switch is coupled to the anode of the first LED; and
the cathode of the second LED is configured to receive a second reference voltage.

9. The electric device of claim 7, wherein:
the first LED comprises an anode and a cathode;
the second LED comprises an anode and a cathode;
the anode of the first LED is configured to receive a first reference voltage;
the driving switch comprises a first terminal, a second terminal and a control terminal;
the first terminal of the driving switch is coupled to the cathode of the second LED; and
the second terminal of the driving switch is configured to receive a second reference voltage.

10. The electric device of claim 1, wherein:
the first control circuit comprises:
   a driving switch coupled to the first LED and the second LED in series;
   a first switch coupled between a control terminal of the driving switch and the first signal line; and
   a second switch comprising a first terminal, a second terminal and a control terminal wherein the first terminal of the second switch is coupled between the first LED and the second LED, the control terminal of the second switch is coupled to the first signal line, and the second terminal of the second switch is coupled to the second signal line.

* * * * *